(12) United States Patent
Zalusky

(10) Patent No.: US 8,229,581 B2
(45) Date of Patent: Jul. 24, 2012

(54) PLACEMENT OF A SOLAR COLLECTOR

(75) Inventor: James Thomas Zalusky, Beavercreek, OH (US)

(73) Assignee: MH Solar Co., Ltd., Taipei (TW)

( * ) Notice: Subject to any disclaimer, the term of this patent is extended or adjusted under 35 U.S.C. 154(b) by 225 days.

(21) Appl. No.: 12/495,164

(22) Filed: Jun. 30, 2009

(65) Prior Publication Data

US 2010/0004797 A1 Jan. 7, 2010

Related U.S. Application Data

(60) Provisional application No. 61/077,998, filed on Jul. 3, 2008.

(51) Int. Cl.
| | |
|---|---|
| *G05B 13/02* | (2006.01) |
| *G05B 21/00* | (2006.01) |
| *G05B 13/00* | (2006.01) |
| *G01M 1/38* | (2006.01) |
| *G05D 23/00* | (2006.01) |
| *F24J 2/38* | (2006.01) |
| *G01C 21/02* | (2006.01) |
| *G01C 21/24* | (2006.01) |

(52) U.S. Cl. .......... 700/56; 700/275; 700/279; 700/302; 126/573; 126/574; 250/203.4

(58) Field of Classification Search .............. 700/56, 700/275, 279, 302; 126/573–574; 250/203.4
See application file for complete search history.

(56) References Cited

U.S. PATENT DOCUMENTS

| | | | |
|---|---|---|---|
| 3,696,286 A | 10/1972 | Ule | |
| 3,797,476 A | 3/1974 | Tarcici | |
| 3,985,579 A | 10/1976 | Rahilly | |
| 4,154,219 A | 5/1979 | Gupta et al. | |
| 4,178,913 A * | 12/1979 | Hutchison | .............. 126/601 |
| 4,202,321 A | 5/1980 | Volna | |
| 4,219,729 A | 8/1980 | Smith | |
| 4,223,214 A * | 9/1980 | Dorian et al. | .............. 250/203.4 |
| 4,248,643 A | 2/1981 | Peters | |
| 4,249,514 A | 2/1981 | Jones | |
| 4,262,195 A | 4/1981 | White et al. | |
| 4,296,731 A | 10/1981 | Cluff | |

(Continued)

FOREIGN PATENT DOCUMENTS

CA 1 132 869 10/1982

(Continued)

OTHER PUBLICATIONS

Printout of http://www.frederickscom.com/sens_tech_select.tpl; 3 pages; printed from Internet on Oct. 8, 2011.*

(Continued)

*Primary Examiner* — Ronald Hartman, Jr.
(74) *Attorney, Agent, or Firm* — Turocy & Watson, LLP

(57) ABSTRACT

When using a solar concentrator to obtain energy collected from the sun, it can be beneficial to place the concentrator accurately. As the concentrator moves, a position of the concentrator with respect to gravity can be determined, such as through the use of an inclinometer. A comparison can be made of the determined position against a desired position. The comparison can be made to determine if the concentrator should move. If a positive determination is made, then the concentrator can be moved accordingly.

21 Claims, 10 Drawing Sheets

U.S. PATENT DOCUMENTS

| | | | | |
|---|---|---|---|---|
| 4,315,163 | A | 2/1982 | Bienville | |
| 4,328,789 | A * | 5/1982 | Nelson | 126/579 |
| 4,354,484 | A * | 10/1982 | Malone et al. | 126/602 |
| 4,364,183 | A | 12/1982 | Rhodes | |
| 4,392,008 | A | 7/1983 | Cullis | |
| 4,409,422 | A | 10/1983 | Sater | |
| 4,445,030 | A | 4/1984 | Carlton | |
| 4,496,787 | A | 1/1985 | Touchais et al. | |
| 4,501,469 | A | 2/1985 | Merges et al. | |
| 4,516,314 | A | 5/1985 | Sater | |
| 4,583,520 | A | 4/1986 | Dietrich et al. | |
| 4,656,996 | A | 4/1987 | Aharon | |
| 4,720,170 | A | 1/1988 | Learn, Jr. | |
| 4,771,764 | A | 9/1988 | Cluff | |
| 5,022,929 | A | 6/1991 | Gallois-Montbrun | |
| 5,125,743 | A | 6/1992 | Rust et al. | |
| 5,187,361 | A | 2/1993 | Ishii et al. | |
| 5,223,043 | A | 6/1993 | Olson et al. | |
| 5,293,447 | A | 3/1994 | Fanney | |
| 5,374,939 | A * | 12/1994 | Pullen V | 343/839 |
| 5,473,166 | A | 12/1995 | Imai et al. | |
| 5,522,944 | A | 6/1996 | Elazari | |
| 5,616,913 | A * | 4/1997 | Litterst | 250/203.4 |
| 5,707,458 | A | 1/1998 | Nagashima et al. | |
| 5,758,938 | A | 6/1998 | Osterwisch | |
| 5,798,517 | A | 8/1998 | Berger | |
| 5,862,799 | A | 1/1999 | Yogev et al. | |
| 5,899,071 | A | 5/1999 | Stone et al. | |
| 5,964,216 | A | 10/1999 | Hoffschmidt et al. | |
| 5,982,481 | A | 11/1999 | Stone et al. | |
| 6,018,122 | A | 1/2000 | Hibino et al. | |
| 6,018,123 | A | 1/2000 | Takada | |
| 6,080,927 | A | 6/2000 | Johnson | |
| 6,123,067 | A * | 9/2000 | Warrick | 126/593 |
| 6,127,620 | A | 10/2000 | Tange et al. | |
| 6,281,426 | B1 | 8/2001 | Olson et al. | |
| 6,284,968 | B1 | 9/2001 | Niesyn | |
| 6,485,152 | B2 | 11/2002 | Wood | |
| 6,597,709 | B1 | 7/2003 | Diver, Jr. | |
| 6,662,801 | B2 | 12/2003 | Hayden | |
| 6,704,607 | B2 * | 3/2004 | Stone et al. | 700/56 |
| 6,848,442 | B2 | 2/2005 | Haber | |
| 6,936,760 | B2 | 8/2005 | Rogers et al. | |
| 6,984,050 | B2 | 1/2006 | Nakamura | |
| 7,076,965 | B2 | 7/2006 | Lasich | |
| 7,079,317 | B2 | 7/2006 | Baun et al. | |
| 7,092,156 | B2 | 8/2006 | Baun et al. | |
| 7,109,461 | B2 | 9/2006 | Lasich | |
| 7,197,829 | B2 | 4/2007 | Acres | |
| 7,357,132 | B2 | 4/2008 | Hayden | |
| 7,709,730 | B2 | 5/2010 | Johnson et al. | |
| 7,825,327 | B2 | 11/2010 | Johnson et al. | |
| 7,834,303 | B2 * | 11/2010 | Fatehi et al. | 250/203.4 |
| 7,873,490 | B2 * | 1/2011 | MacDonald | 702/127 |
| 2002/0179138 | A1 | 12/2002 | Lawheed | |
| 2003/0045949 | A1 * | 3/2003 | Stone et al. | 700/61 |
| 2004/0216777 | A1 | 11/2004 | Pan | |
| 2005/0016581 | A1 | 1/2005 | Fujisaki et al. | |
| 2005/0109387 | A1 | 5/2005 | Marshall | |
| 2007/0034205 | A1 | 2/2007 | Watts | |
| 2007/0095341 | A1 * | 5/2007 | Kaneff | 126/601 |
| 2007/0145252 | A1 | 6/2007 | Litchfield et al. | |
| 2007/0150198 | A1 | 6/2007 | MacDonald | |
| 2007/0151245 | A1 | 7/2007 | Coffey et al. | |
| 2007/0215198 | A1 | 9/2007 | Jiang et al. | |
| 2007/0227574 | A1 | 10/2007 | Cart | |
| 2007/0251564 | A1 | 11/2007 | Smith | |
| 2007/0251569 | A1 | 11/2007 | Shan et al. | |
| 2008/0011288 | A1 | 1/2008 | Olsson | |
| 2008/0017784 | A1 | 1/2008 | Hoot et al. | |
| 2008/0040990 | A1 | 2/2008 | Vendig et al. | |
| 2008/0087318 | A1 | 4/2008 | Jwo | |
| 2008/0128559 | A1 | 6/2008 | Ho et al. | |
| 2009/0056699 | A1 * | 3/2009 | Mills et al. | 126/600 |
| 2009/0114211 | A1 * | 5/2009 | Homyk et al. | 126/578 |
| 2009/0126774 | A1 * | 5/2009 | Taylor et al. | 136/244 |
| 2009/0205637 | A1 * | 8/2009 | Moore et al. | 126/576 |
| 2009/0293861 | A1 * | 12/2009 | Taylor et al. | 126/600 |
| 2010/0000519 | A1 | 1/2010 | Zalusky et al. | |
| 2010/0000522 | A1 | 1/2010 | Zahuranec | |
| 2010/0006139 | A1 | 1/2010 | Zahuranec et al. | |
| 2010/0263659 | A9 * | 10/2010 | Taylor et al. | 126/600 |
| 2011/0048403 | A1 * | 3/2011 | Stavrou et al. | 126/573 |

FOREIGN PATENT DOCUMENTS

| | | |
|---|---|---|
| CN | 101093114 A | 12/2007 |
| EP | 1919029 | 5/2008 |
| ES | 2114826 | 6/1998 |
| GB | 2 426 324 A | 11/2006 |
| JP | 62166110 | 7/1987 |
| JP | 63096447 A | 4/1988 |
| JP | 7 038 131 A | 2/1995 |
| JP | 8130322 | 5/1996 |
| JP | 200153322 | 2/2001 |
| JP | 2004-312054 A | 11/2004 |
| JP | 2005018352 A | 1/2005 |
| JP | 2005038270 | 2/2005 |
| KR | 100343263 B1 | 6/2002 |
| WO | 2008013976 A2 | 1/2008 |
| WO | WO2008003023 * | 3/2008 |
| WO | 2008117297 A2 | 10/2008 |

OTHER PUBLICATIONS

Printout of http://www.frederickscom.com/sens_tilt_0717_4304.tpl; 1 page; printed from Internet on Oct. 8, 2011.*

The Fredericks Company, Model 0717-4303-99 data sheet; 2 pages; printed from Internet on Oct. 8, 2011.*

Written Opinion and International Search Report mailed Nov. 10, 2009 for PCT Application No. PCT/US 09/49610, 25 pages.

Building Integrated, Infrastructure, and Utility Scale Solar Power. http://www.power-spar.com/Power-Spar/index.phpwww-powerspar.com. Last accessed Aug. 14, 2009, 1 page.

Sater, et al. High Voltage Silicon VMJ Solar Cells for up to 1000 Suns Intensities. Photovoltaic Specialists Conference 2002. Conference Record of the Twenty-Ninth IEEE, May 19-24, 2002, pp. 1019-1022. Last accessed Oct. 1, 2009, 4 pages.

OA dated Dec. 22, 2011 for U.S. Appl. No. 12/496,034, 35 pages.
OA dated Nov. 21, 2011 for U.S. Appl. No. 12/495,398, 30 pages.
OA dated Nov. 14, 2011 for U.S. Appl. No. 12/496,150, 36 pages.
OA dated Nov. 4, 2011 for U.S. Appl. No. 12/496,541, 48 pages.
Australian Office Action mailed Oct. 18, 2011 for AU Application No. 2009266870, 3 pages.
Final Office Action dated Apr. 16,2012 for U.S. Appl. No. 12/495,398, 36 pages.
Non-Final Office Action dated Mar. 30, 2012 for U.S. Appl. No. 12/495,136, 41 pages.
Final Office Action dated Mar. 1, 2012 for U.S. Appl. No. 12/496,541, 31 pages.

* cited by examiner

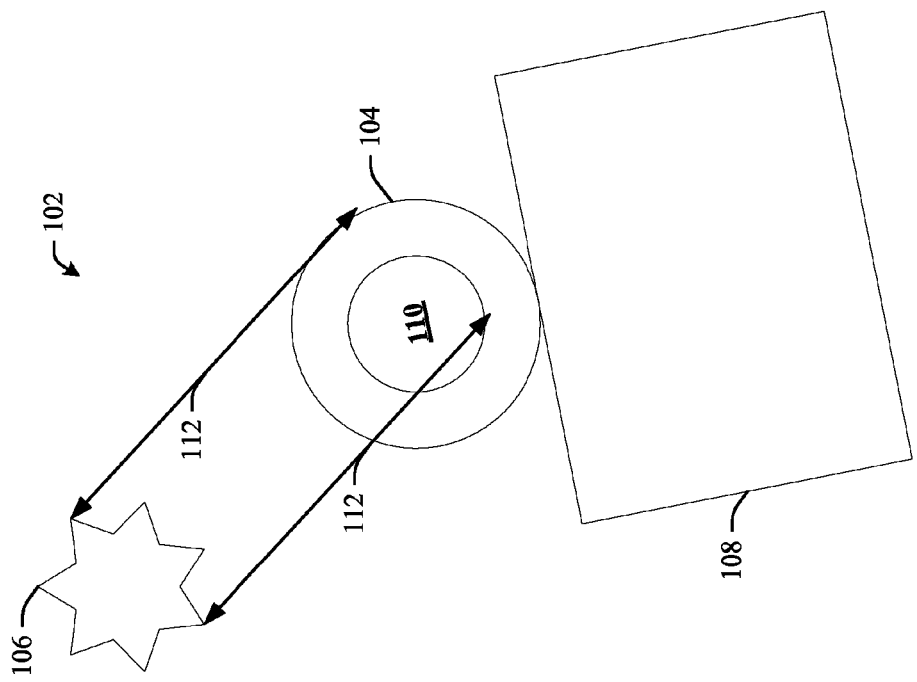
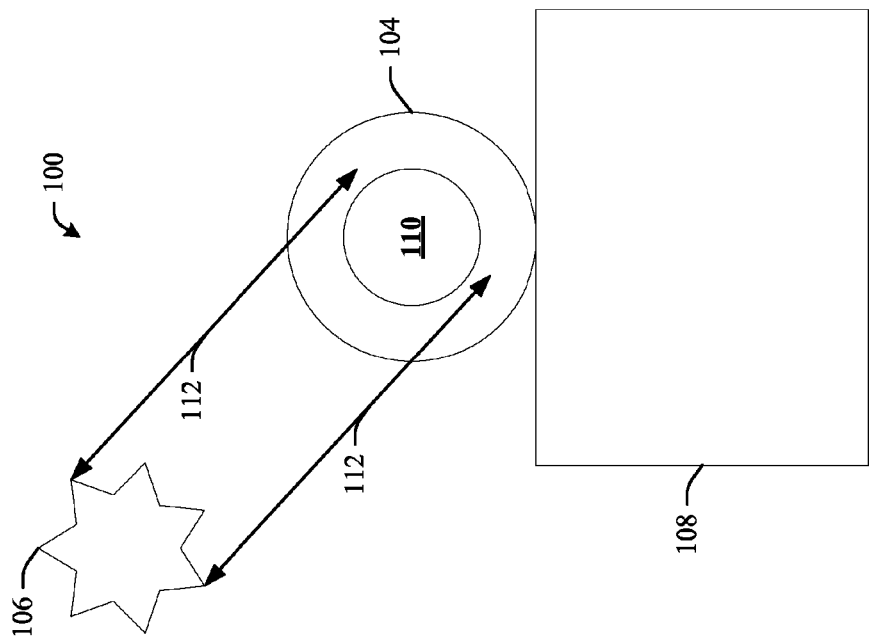
FIG. 1

PLACEMENT OF A SOLAR COLLECTOR

CROSS-REFERENCE

This application claims priority to U.S. patent application Ser. No. 61/077,998 entitled "PLACEMENT OF A SOLAR COLLECTOR", which was filed on Jul. 3, 2008. The entirety of which is herein incorporated by reference.

TECHNICAL FIELD

The subject specification relates generally to solar power and in particular to accurately positioning a solar collector.

BACKGROUND

Limited supply of fossil energy resources and their associated global environmental damage have compelled market forces to diversify energy resources and related technologies. One such resource that has received significant attention is solar energy, which employs photovoltaic technology to convert light into electricity. Typically, photovoltaic production has been doubling every two years, increasing by an average of 48 percent each year since year 2002, making it the world's fastest-growing energy technology. By midyear 2008, estimates for cumulative global solar energy production stands to at least 12,400 megawatts. Approximately 90% of such generating capacity consists of grid-tied electrical systems, wherein installations can be ground-mounted or built into the roof or the walls of a building, known as Building Integrated Photovoltaic (BIPV).

Moreover, significant technological progress has been achieved in design and production of solar panels, which are further accompanied by increased efficiency and reductions in manufacturing cost. In general, a major cost element involved in establishment of a wide-scale solar energy collection system is the cost of the support structure, which is employed to mount the solar panels of the array in proper position for receiving and converting solar energy. Other complexities in such arrangements involve efficient operations for the photovoltaic elements.

The photovoltaic elements for converting light to electric energy are commonly applied as solar cells to power supplies for small power in consumer-oriented products, such as desktop calculators, watches, and the like. Such systems are drawing attention as to their practical use for future alternate power of fossil fuels. In general, photovoltaic elements are elements employing the photoelectromotive force (photovoltage) of the pn junction, the Schottky junction, or semiconductors, in which the semiconductor of silicon, or the like absorbs the light to generate photocarriers such as electrons and holes, and the photocarriers drift outside due to an internal electric field of the pn junction part.

One common photovoltaic element employs single-crystal silicon as a material, and semiconductor processes produce most of such photovoltaic elements. For example, a crystal growth process prepares a single crystal of silicon valency-controlled in the p-type or in the n-type, wherein such single crystal is subsequently sliced into silicon wafers to achieve desired thicknesses. Furthermore, the p-n junction can be prepared by forming layers of different conduction types, such as diffusion of a valance controller to make the conduction type opposite to that of a wafer.

Moreover, solar energy collection systems are employed for a variety of purposes, for example, as utility interactive power systems, power supplies for remote or unmanned sites, and cellular phone switch-site power supplies. An array of energy conversion modules, such as, photovoltaic (PV) modules, in a solar energy collection system can have a capacity from a few kilowatts to a hundred kilowatts or more, depending upon the number of PV modules, also known as solar panels, used to form the array. The solar panels can be installed wherever there is exposure to the sun for significant portions of the day.

Typically, a solar energy collection system includes an array of solar panels arranged in the form of rows and mounted on a support structure. Such solar panels can be oriented to optimize the solar panel energy output to suit the particular solar energy collection system design requirements. Solar panels can be mounted on a fixed structure, with a fixed orientation and fixed tilt, or can be mounted on a tracking structure that aims the solar panels toward the sun as the sun moves across the sky during the day and as the sun path moves in the sky during the year.

Nonetheless, controlling temperature of the photovoltaic cells remains critical for operation of such systems, and associated scalability remains a challenging task. Common approximations conclude that typically about 0.3% power is lost for every 1 degree Celsius rise in the photovoltaic cell.

SUMMARY

The following discloses a simplified summary of the specification in order to provide a basic understanding of some aspects of the specification. This summary is not an extensive overview of the specification. It is intended to neither identify key or critical elements of the specification nor delineate the scope of the specification. Its sole purpose is to disclose some concepts of the specification in a simplified form as a prelude to the more detailed description that is disclosed later.

In conventional operation, a solar concentrator can be positioned through use of an encoder. The encoder can be programmed with solar position estimations based upon a time and date; a time and date can be gathered and based upon the gathered information an appropriate position for the concentrator can be determined. However, if a solar concentrator configuration is intentionally moved, movement occurs through natural occurrence, etc., then the encoder can become less accurate without reprogramming.

With the disclosed innovation, a measurement of a force placed upon a solar concentrator with respect to gravity can be calculated and used in conjunction with placing the solar concentrator. A comparison can be made between the measurement and a desired value to determine where to place the solar concentrator. Accordingly, an instruction to move the receiver can be generated and transferred to a motor system. With regard to one embodiment, a pair of inclinometers can be firmly attached to a solar dish such that an angle that the dish is pointed with respect to gravity can be measured.

The following description and the annexed drawings set forth certain illustrative aspects of the specification. These aspects are indicative, however, of but a few of the various ways in which the principles of the specification can be employed. Other advantages and novel features of the specification will become apparent from the following detailed description of the specification when considered in conjunction with the drawings.

BRIEF DESCRIPTION OF THE DRAWINGS

FIG. 1 illustrates a representative configuration of an energy collector aligned with an energy source in accordance with an aspect of the subject specification.

DETAILED DESCRIPTION

Figure 2:
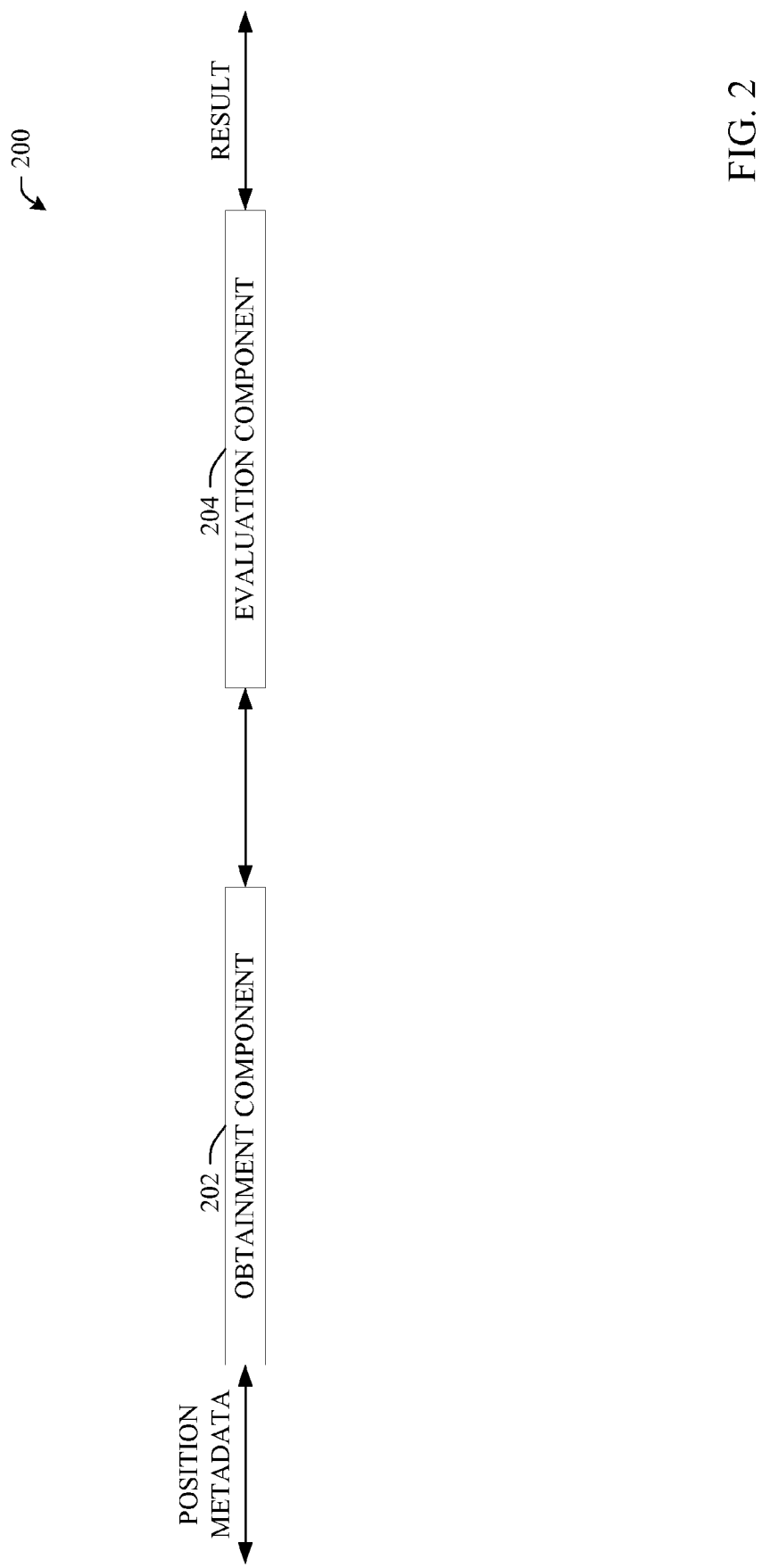
FIG. 2 illustrates a representative system for comparing a desired energy collector location against an actual location in accordance with an aspect of the subject specification.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It can be evident, however, that the claimed subject matter can be practiced without these specific details. In other instances, well-known structures and devices are shown in block diagram form in order to facilitate describing the claimed subject matter.

As used in this application, the terms "component," "module," "system," "interface," or the like are generally intended to refer to a computer-related entity, either hardware, a combination of hardware and software, software, or software in execution. For example, a component can be, but is not limited to being, a process running on a processor, a processor, an object, an executable, a thread of execution, a program, and/or a computer. By way of illustration, both an application running on a controller and the controller can be a component. One or more components can reside within a process and/or thread of execution and a component can be localized on one computer and/or distributed between two or more computers. As another example, an interface can include I/O components as well as associated processor, application, and/or API components.

Now referring to FIG. 1, an example solar disk configuration is disclosed in two different states 100 and 102. A configuration can present a solar dish 104 that can be aligned with an energy source 106 (e.g., the sun upon which the Earth revolves). The solar dish 104 can rest upon a base 108 (e.g., be coupled to the base) that sits upon the ground, where the base 108 is commonly constructed from metal, concrete, wood, and the like. To collect solar energy, the solar dish 104 can include a concentrator 110 that can function as a solar cell. The first state configuration 100 can represent a place in time immediately after construction of the solar dish 104 with the base 108. Conversely, the second state configuration 102 can represent a place in time after construction where the base 108 settles, the ground settles, the configuration 100 is physically moved to a location that changes the configuration 100 to the configuration 102, etc. While the concentrator 110 is shown as part of a solar dish 104, it is to be appreciated that various configurations can be practiced without use of a solar dish 104, such as an independent unit.

Various circumstances can arise such that the configuration changes (e.g., changes in a manner from first state configuration 100 to second state configuration 102). For instance, certain materials can settle over time (e.g., concrete) and thus the solar dish 104 (e.g., a disk that includes a solar concentrator) no longer alights correctly with the energy source 106. In one example, the solar dish 104 can include a concentrator 110 coupled to the middle of the dish 104. As can be seen in FIG. 1, originally the energy source 106 and solar dish 104 are both aligned centrally (e.g., configuration state 100) which allows the concentrator 110 to be completely within major energy bounds 112 of the energy source 106 (e.g., being within the energy bounds enables maximum energy gathering). However, there is only partial alignment with the solar dish 104 and energy source 106 after movement (e.g., configuration state 102) and the concentrator 110 is no longer completely within energy bounds of 112—thus the concentrator 110 can be in a less than optimal position for gathering energy. If using a conventional encoder, the change in the configuration is not appreciated and thus the configuration does not operate as desired (e.g., the energy source 106 does not produce solar energy correctly upon the concentrator).

An inclinometer used in accordance with aspects disclosed herein can be a solid state sensor, commonly silicon-based. A mass can be suspended with a small piece of silicon connecting the mass to a stable point (e.g., a support structure). The mass can also include wings to improve functionality. Electrostatic force can move the mass such that the mass is in the center of an area. If an associated unit is pointed up at an angle, then the mass can be drawn down. Voltage can be supplied that counters forces to place the mass back in the center. A measurement of the voltage used to place the mass back in the center of the area can be analyzed to determine an angle with respect to gravity.

Therefore, with the disclosed innovation, the solar dish 104 can be adjusted automatically based upon alignment changes and thus the concentrator 110 can be brought into the energy bounds of 112 in configuration state 102. A measurement can be taken of an angle of the solar dish 104 and/or concentrator 110 with respect to gravity to determine actual position and a calculation can be made of a desired position. If the actual position is not about equal to the desired position, the solar dish 104, the base 106, as well as other entities can move to correct alignment. According to one embodiment the configuration 102 can remove alignment errors with the concentrator 110 by searching for a maximum current from at least one photovoltaic cell. The solar dish 104 can move in a pattern seeking a maximum output. A relative position of this maximum compared to an output of the concentrator 110 can allow a misalignment to be corrected. This correction can also be incorporated to an open loop ecliptic calculation used to point at the energy source 106 accurately even when hidden (e.g., by clouds).

Now referring to FIG. 2, an example system 200 is disclosed for determining if a receiver (e.g., the solar dish 104 of FIG. 1, a concentrator 110 of FIG. 1, etc.) should be adjusted in accordance with positional change. In conventional operation, as an energy source changes position with the receiver (e.g., change between the Earth's sun and a solar disk due to the Earth's rotation around the sun), the receiver can move along to follow the source. However, there can be times that the source cannot be physically tracked, such as on a cloudy day or during nighttime (e.g., anticipating where the sun will rise). In these cases, anticipation can be used to determine where the receiver should be placed, such as positioning the receiver to be located where the sun is anticipated to rise.

To facilitate operation, a desired position for the receiver can be calculated based upon time, date, longitude, latitude, etc. Additionally, at least one inclinometer can be used to measure an angle of a receiver with respect to gravity. An obtainment component 202 can collect a position of a receiver with respect to gravity, commonly observed by the inclinometer. The obtainment component 202 can function to gather metadata that pertains to a desired position of the receiver as well as an actual position.

The obtainment component 202 can transfer collected data such as the desired location and gravity information to an evaluation component 204. In addition, the obtainment component 202 and/or the evaluation component 204 can process the gravity information to determine an actual position of the receiver. The evaluation component 202 can compare the receiver position (e.g., actual position) against a desired position of the receiver in relation to an energy source, the comparison is used to determine a manner in which the receiver should be moved (e.g., how to move the receiver, when to move the receiver, where to move the receiver, if the receiver should be moved at all, and the like). According to an alternate embodiment, raw gravity data (e.g., representing receiver position) can be compared against an expected gravitational force (e.g., representing desired position) by the evaluation component 204. The evaluation component 204 can transfer a result to an entity, such as a motor, e.g., a step motor, capable of moving the receiver from an actual position to a desired position.

Additionally, the evaluation component 204 can update operation of the receiver and related units such that the desired result is attempted automatically. For instance, solar panel with concentrator can physically be moved about one mile and thus pre-determined calculations for positioning can be inaccurate. With measuring gravity (e.g., angle of the receiver against gravity), it can be determined that the actual position of the receiver should move. With this new knowledge, a reset can occur such that receiver is moved according to the offset (e.g., follows a path from after the move as opposed to before the move).

Thus, there can be an obtainment component 202 that collects metadata of a position with respect to gravity of a concentrator (e.g., an entity capable of collecting energy) capable of energy collection from a celestial energy source (e.g., sun). According to one embodiment, the metadata is collected from an inclinometer. Additionally, an evaluation component 204 can be used to compare the concentrator position against a desired position of the concentrator in relation to the celestial energy source, the comparison is used to determine a manner in which to make an alteration to increase effectiveness (e.g., maximize effectiveness) of the concentrator. For example, the alteration can be to move the solar dish 104 of FIG. 1.

Figure 3:
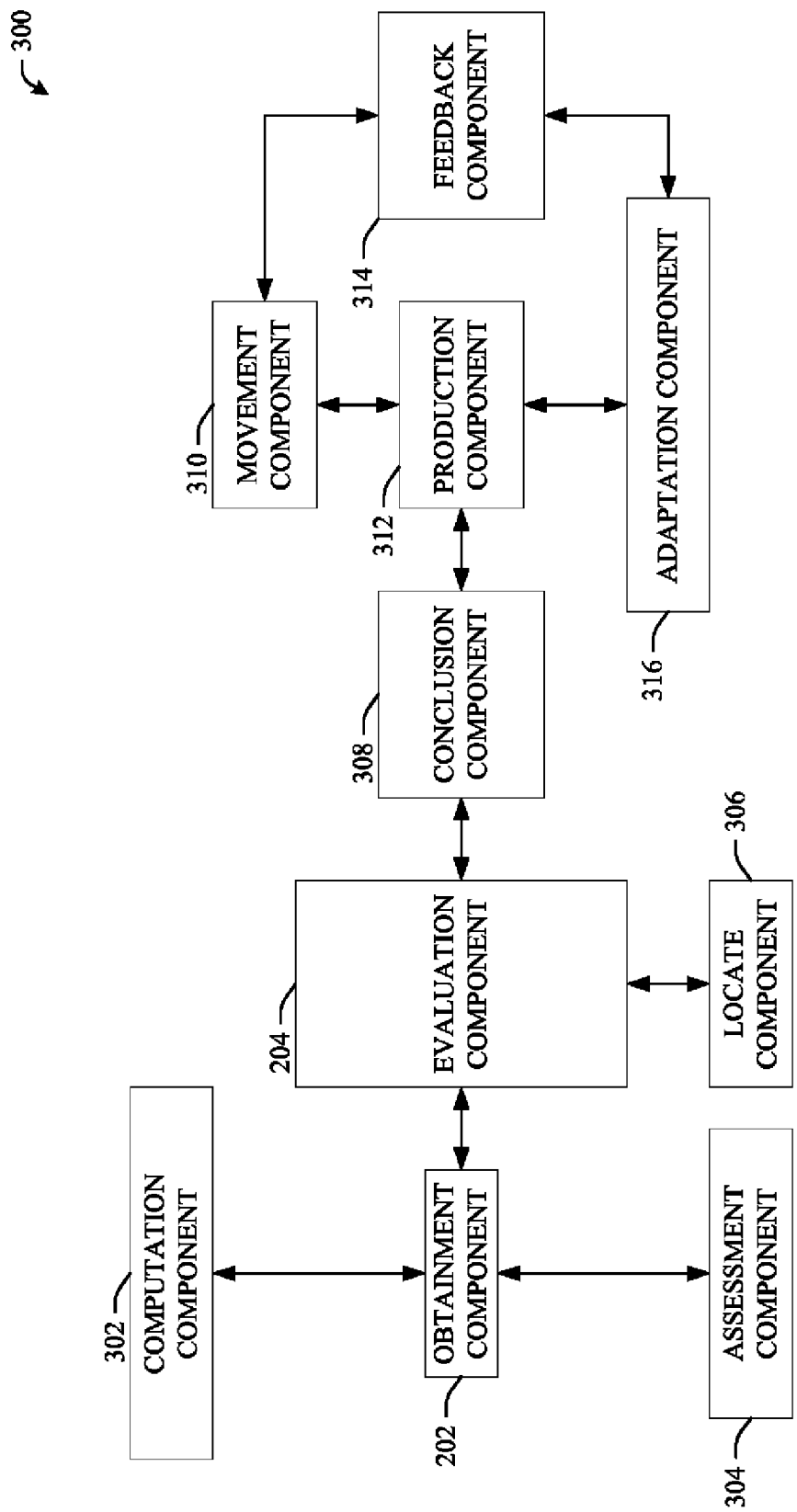
FIG. 3 illustrates a representative system for aligning an energy collector with relation to gravity in accordance with an aspect of the subject specification.

Now referring to FIG. 3, an example system 300 is disclosed to assist in positioning a receiver in relation to an energy source. An obtainment component 202 can collect a position of a receiver with respect to gravity (e.g., collect position information). A computation component 302 can calculate the desired position of the energy source (e.g., a location of the energy source that allows for improved or maximum coverage toward a solar concentrator). According to one embodiment, the desired position is calculated by factoring date, time, longitude of the receiver, and latitude of the receiver. An internal clock can measure the time and date, as well as have the time and date transferred from an auxiliary entity (e.g., a satellite) and latitude and/or longitude information can be gained from a global positioning system. In addition, an assessment component 304 can determine an actual position of the receiver through a measurement of an angle of gravity upon the receiver. Output of the computation component 302 and/or the assessment component 304 can be collected by the obtainment component 202 and can be used by an evaluation component 204. The assessment component 304 can function as means for calculating the location of a collector through analysis of metadata that relates to gravity exerted upon the collector. Moreover, the computation component 302 can operate as means for computing the desired location of the collector, the calculation is based upon date, time, longitude of the receiver, and latitude of the collector. Additionally, the obtainment component 202 can implement as means for obtaining the metadata that relates to gravity exerted upon the collector from a means for measuring.

The evaluation component 204 can compare the receiver position against a desired position of the receiver in relation to an energy source, the comparison is used to determine a manner in which the receiver should be moved. However, it is possible that more efficient manners and/or manners that are more accurate can be used to adjust the receiver. For instance, if the energy source can be optically tracked, then it could be more beneficial not to use the system 300. The evaluation component 204 can function as means for comparing the calculated location of the collector against the desired location of the collector. Therefore, a locate component 306 can conclude if a location of an energy source can be determined (e.g., optically), where the evaluation component 204 operates upon a negative conclusion. Artificial intelligence techniques can be used to weight benefits of different manners of determining where the receiver should locate.

A conclusion component 308 can decide if the receiver should move as a function of a result of the comparison. According to one embodiment, the conclusion component 308 can consider multiple factors in addition to an outcome of the evaluation component 204. In an aspect, conclusion component 308 can generate a cost-utility analysis based at least in part on AI techniques and the considered multiple factors to assess viability of movement of the receiver. As an example, there can be a very slight discrepancy between an actual position and a desired position where power consumed, e.g., the cost, to move the receiver would outweigh what is anticipated to be gained, the utility, from a move. As another example, when the concentration is operated in adverse operational conditions such as weather condition(s), e.g., sustained high wind, cloudy atmosphere, cost of power consumed to move the concentrator can outweigh the benefit of operation in a desired position. Therefore, the conclusion component 308 could determine that movement should not take place even if there is a positional difference. Additionally, even if there is a difference between actual and desired positions, if it is not estimated that there is to be any energy lost upon a concentrator, then the conclusion component 308 can determine a move is not appropriate. The conclusion component 308 can operate as means for concluding if the collector should move based upon a result of the comparison.

The system 300 can use a movement component 310 (e.g., a motor, an entity that drives a motor, etc.) with the power to move the receiver. Since different movement components 310 can operate differently, a specific direction set can be generated upon how the receiver should be moved. A production component 312 can generate a direction set, the direction set instructs how the receiver should be moved. The production component 312 can transfer the direction set to the movement component 310. The production component 312 can operate as means for producing a direction set, the direction set instructs how the collector should be moved and is implemented by a collector shift entity.

It is possible that the direction set did not implement as anticipated. For instance, due to wear over time, parts of a motor can alter functionality and not perform as anticipated. A feedback component 314 can determine if the direction set resulted in a desired outcome upon the direction set being implemented by the movement component 310. In an aspect, the feedback component 314 can exploit, and include, one or more inclinometers to determine if a collector or receiver has been moved as dictated by the direction set. For instance, if after the direction set has been implemented an angle of the collector with respect to the gravitational field is not a target angle, then feedback component 314 can determine the outcome is not as intended. Accordingly, through utilization of one or more inclinometers, feedback component 314 can diagnose, at least in part, integrity of a movement operation, which can be effected by movement component 310. As an example of integrity of movement operation, feedback component 314 can determine that a preferred position such as a non-production maintenance position is achieved. If the direction set results in the desired outcome (e.g., movement of the receiver to the desired location), then a confidence rating can be increased that relates to operation of the production component 312. However, if the feedback component 314 determines that the desired outcome is not reached, then an adaptation component 316 can modify operation of the production component 312 with regard to the determination made that concerns direction set (e.g., modify and test computer code used to generate the direction set). It is to be appreciated that the feedback component 314 and/or adaptation component 316 can alter operation of other components of the system 300 or disclosed in the subject specification in a similar manner to improve operation. The feedback component 314 can operate as means for determining if the direction set resulted in a desired outcome upon the direction set being implemented by the collector shift entity. The adaptation component 316 can function as means for modifying operation of the means for producing concerning the determination made that concerns direction set.

Figure 4:
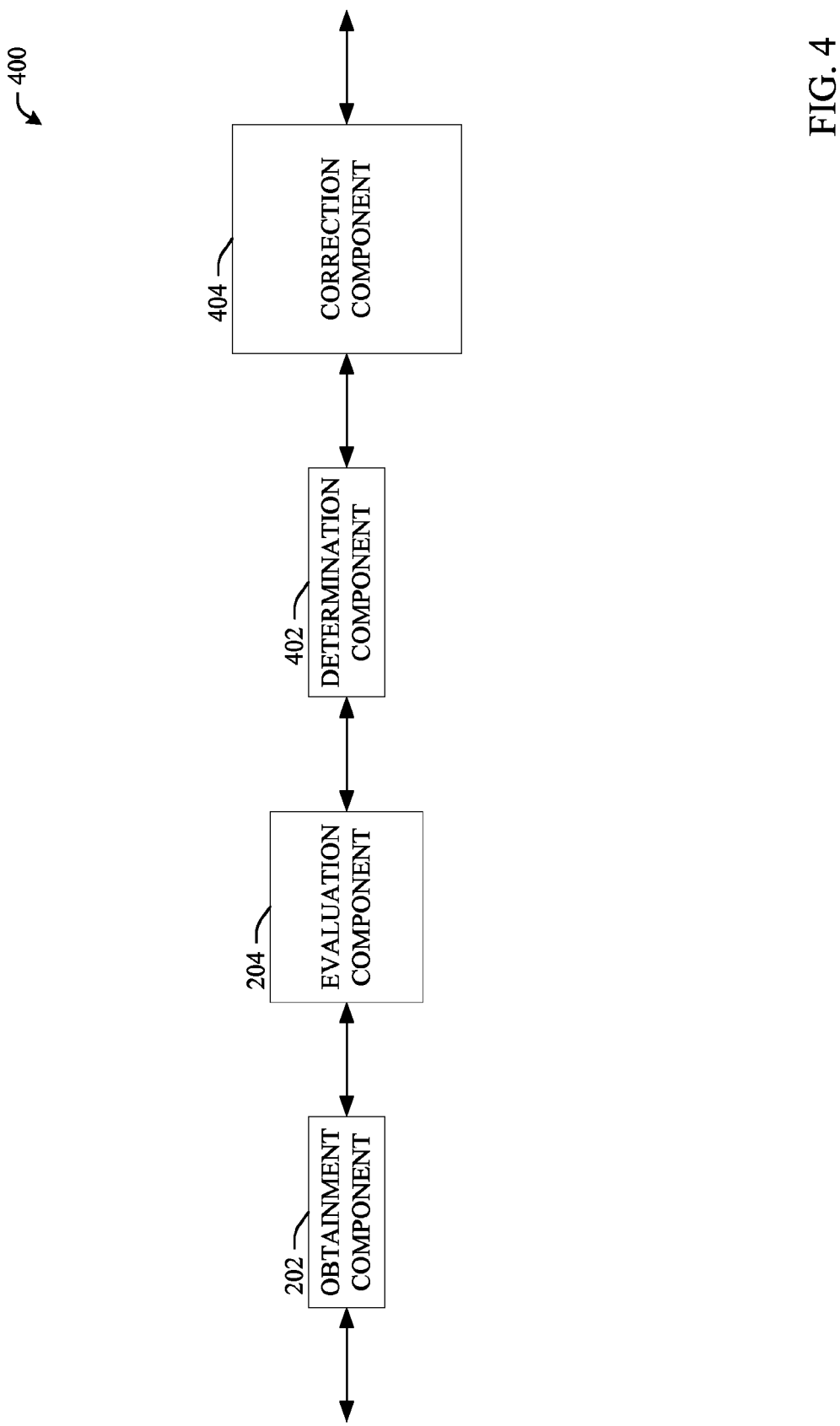
FIG. 4 illustrates a representative system for aligning a gravity determination entity in accordance with an aspect of the subject specification.

Now referring to FIG. 4, an example system 400 is disclosed for adjusting entities that measure gravity information in relation to a receiver. An obtainment component 202 can collect a position of a receiver with respect to gravity, commonly produced by an inclinometer. An evaluation component 204 can compare the receiver position against a desired position of the receiver in relation to an energy source, the comparison can be used to determine a manner in which the receiver should be moved if an actual position and desired position are not substantially equal.

It is possible that at least one inclinometer can be misaligned such that an accurate result is not produced. A determination component 402 can identify a misalignment or offset of an entity that measures position of the receiver with respect to gravity. The identification can take place through processing user input (e.g., from a technician), through artificial intelligence techniques, etc. The determination component 402 can operate as means for identifying a misalignment or an offset of the means for measuring the position of the collector with respect to gravity. A correction component 404 can automatically determine a manner in which to adjust the misalignment or the offset and make an appropriate correction. The correction component 404 can implement as means for correcting a misalignment or an offset of the means for measuring the position of the collector with respect to gravity.

Figure 5:
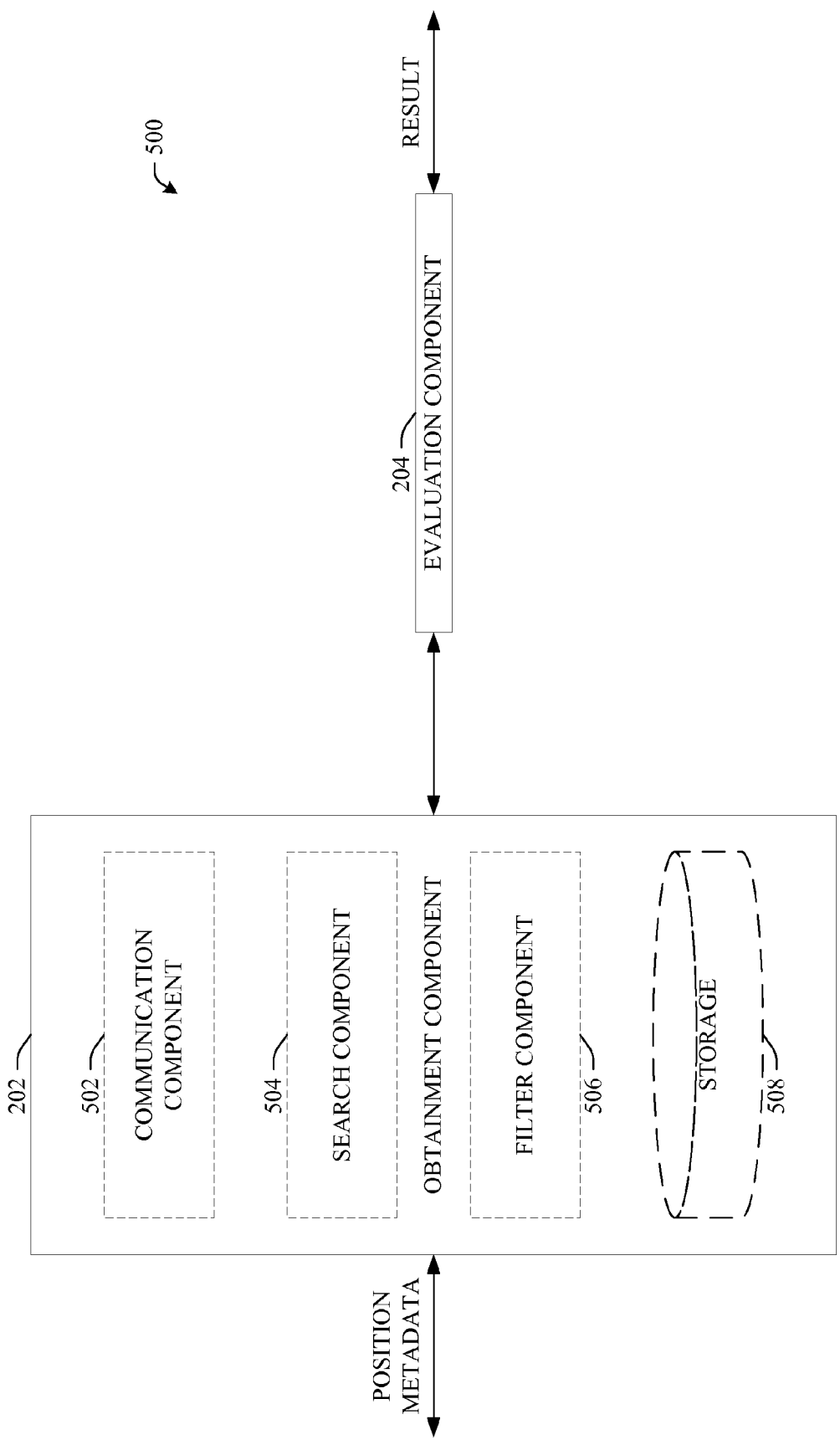
FIG. 5 illustrates a representative system for comparing a desired energy collector location against an actual location with a detailed obtainment component in accordance with an aspect of the subject specification.

Now referring to FIG. 5, an example system 500 is disclosed for positioning a solar receiver with a detailed obtainment component 202. The obtainment component 202 can collect a position of a receiver with respect to gravity. To facilitate operation, the obtainment component 202 can use a communication component 502 to engage with entities (e.g., the computation component 302 of FIG. 3) to transfer information, such as to send a request for information, to receive information from an auxiliary source, etc. Operation can take place wirelessly, in a hard-wired manner, employment of security technology (e.g., encryption), etc. Information transfer can be active (e.g., query/response) or passive (e.g., monitoring of public communication signals). Moreover, the communication component 502 can utilize various protective features, such as performing a virus scan on collected data and blocking information that is positive for a virus. The communication component 502 can operate as means for transferring the instruction set to the collector shift entity, the collector shift entity implements the instruction set.

A search component 504 can be used to locate sources of information. For example, the system 500 can plug into a prefabricated solar dish with concentrator. The search component 504 can identify a location of an inclinometer and perform calibration. Additionally, the search component 504 can be used to identify foreign sources of information. In an illustrative instance, if a configuration does not include an internal clock, then the search component 504 can identify a time source and the obtainment component 202 can collect information from the time source.

While the obtainment component 202 can collect a wide variety of information, too much information can have a negative impact such as consuming valuable system resources. Therefore, a filter component 506 can analyze obtained information and determine what information should pass to an evaluation component 204 that can determine if a receiver should move. In one instance, the filter component 506 can determine a freshness of a gravity reading. If there is little or no change from a previous reading, then information can be deleted and not transferred. According to one embodiment, the filter component 506 can verify information and/or aggregate information. For instance, if a first time is produced by three sources and a second time is produced by one source, the second time can be discounted and one record can be transferred representing the time of the three sources.

Different pieces of information, such as collected metadata, component operating instructions (e.g., communication component 502), source location, components themselves, etc. can be held on storage 508. Storage 508 can be arranged in a number of different configurations, including as random access memory, battery-backed memory, hard disk, magnetic tape, etc. Various features can be implemented upon storage 208, such as compression and automatic back up (e.g., use of a Redundant Array of Independent Drives configuration). In addition, storage 508 can operate as memory that can be operatively coupled to a processor (not shown) and can be implemented as a different memory form than an operational memory form.

Figure 6:
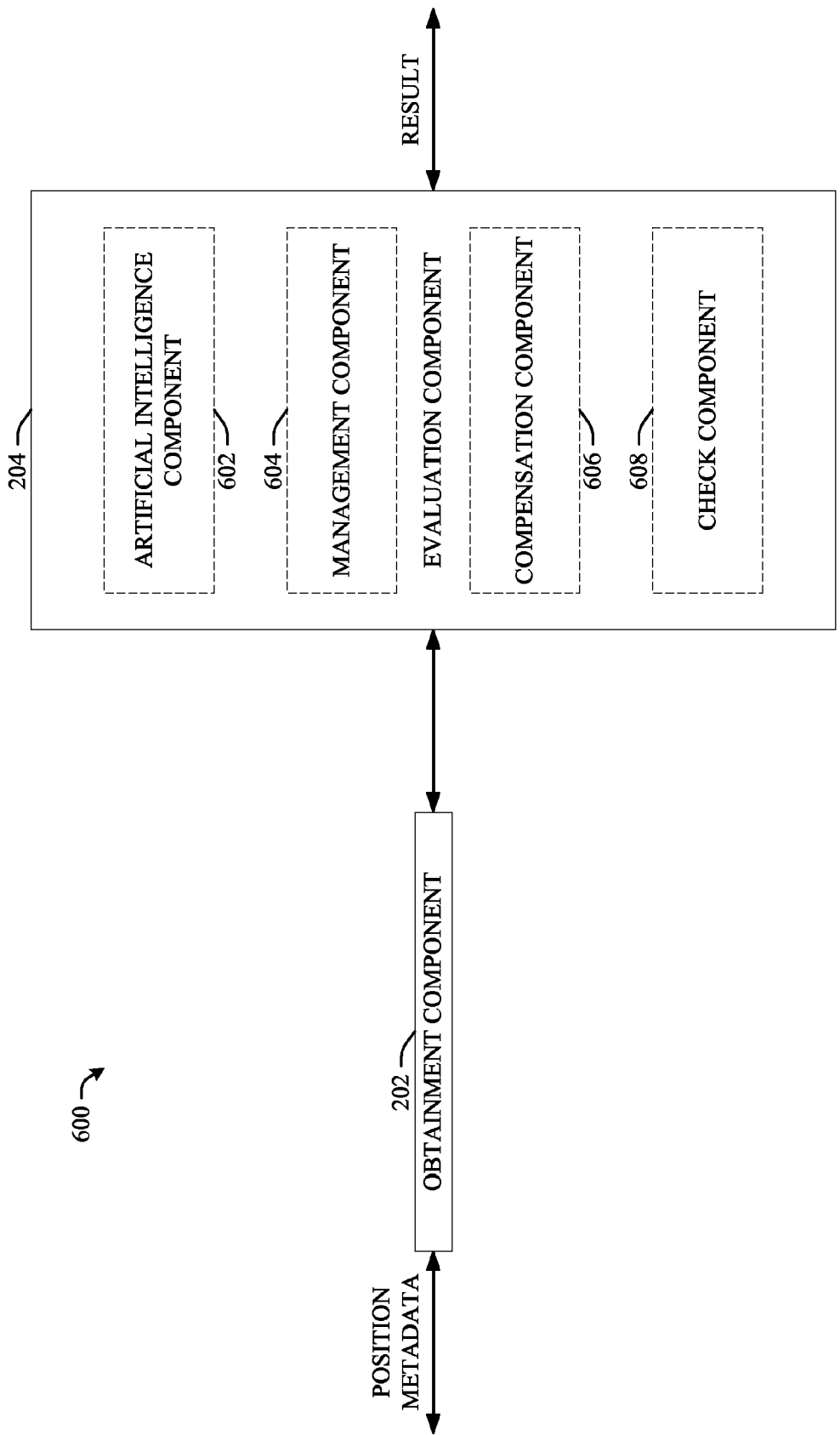
FIG. 6 illustrates a representative system for comparing a desired energy collector location against an actual location with a detailed evaluation component in accordance with an aspect of the subject specification.

Now referring to FIG. 6, an example system 600 is disclosed for positioning a solar receiver with a detailed evaluation component 204. An obtainment component 202 can collect a position of a receiver with respect to gravity. An evaluation component 204 can compare the receiver position against a desired position of the receiver in relation to an energy source, the comparison is used to determine a manner in which the receiver should be moved.

An artificial intelligence component 602 can be used to perform at least one determination or at least one inference in accordance with at least one aspect disclosed herein. For example, artificial intelligence techniques can be used for estimating an amount of power that can be gained from a move of a concentrator. The artificial intelligence component 602 can employ one of numerous methodologies for learning from data and then drawing inferences and/or making determinations related to dynamically storing information across multiple storage units (e.g., Hidden Markov Models (HMMs) and related prototypical dependency models, more general probabilistic graphical models, such as Bayesian networks, e.g., created by structure search using a Bayesian model score or approximation, linear classifiers, such as support vector machines (SVMs), non-linear classifiers, such as methods referred to as "neural network" methodologies, fuzzy logic methodologies, and other approaches that perform data fusion, etc.) in accordance with implementing various automated aspects described herein. In addition, the artificial intelligence component 602 can also include methods for capture of logical relationships such as theorem provers or more heuristic rule-based expert systems. The artificial intelligence component 602 can be represented as an externally pluggable component, in some cases designed by a disparate (third) party.

A management component 604 can regulate operation of the evaluation component 204 as well as other components disclosed herein. For example, there can be relatively long periods of time where the sun cannot be detected. However, it can be pre-mature for the system 600 to operate as soon as the sun cannot be detected since circumstances can change and multiple movements can occur (e.g., while wasting energy). Therefore, the management component 604 can determine an appropriate time for the obtainment component 202 to collect information, to make the comparison, to generate a direction set for movement, etc. Once operating is determined to be reasonable to take place, appropriate instructions can be produced and enforced.

A compensation component 606 can account for extraneous reasons for a result and make appropriate compensation. For instance, during nighttime repairs can be made to a configuration with a collector that is anticipated to complete before sunrise. While there is discrepancy between a desired value and actual, since there is likely going to be an outside correction, it can be wasteful for the system 600 to operate. Therefore, the compensation component 606 can determine that operation should not occur.

A check component 608 can determine that information is appropriately converted to ensure accurate operation. Since information pertaining to actual value or desired value can be collected from different locations, it is possible for the information to be in different formats. For example, desired location gravity information can be represented in feet per second while actual location gravity information can be represented in meters per second. The check component 608 can determine an appropriate format and ensure correct conversion occurs automatically.

Figure 7:
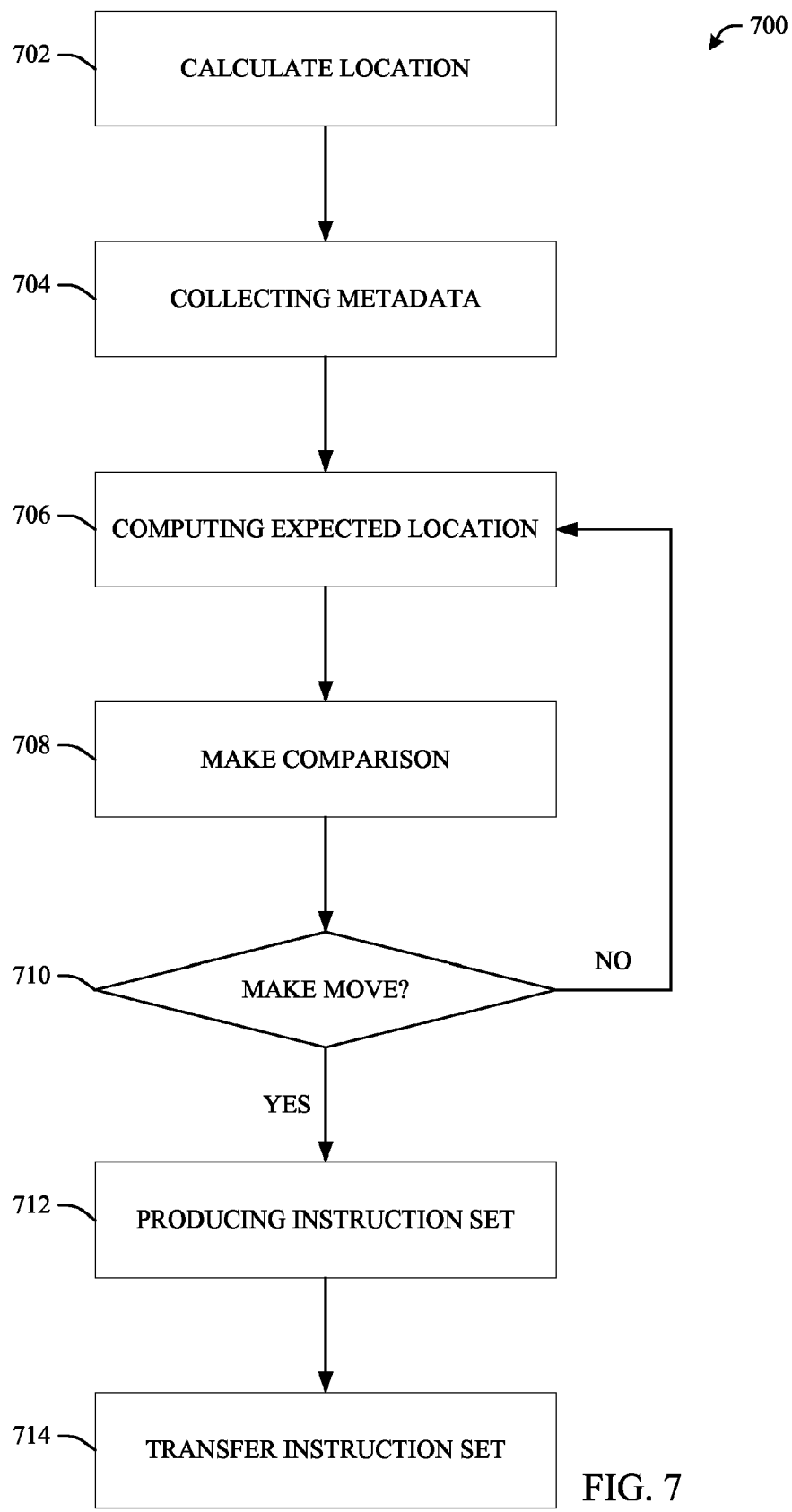
FIG. 7 illustrates a representative energy collection evaluation methodology in accordance with an aspect of the subject specification.

Now referring to FIG. 7, an example methodology 700 is disclosed for managing an energy collector. A current location of an energy collector can be calculated at event 702, commonly based upon gravity exerted upon the collector. Various metadata relating to the collector can be obtained at action 704. Action 704 can represent collecting date information, time information, longitude of the collector information, and latitude of the collector information. Based upon at least a portion of the obtained metadata, there can be act 706 that can include computing an expected location of the collector, the calculation is based upon date, time, longitude of the collector, and latitude of the collector.

The example methodology 700 can also include making a comparison among the calculated location of the collector against an expected location of the collector at action 708. Commonly, the calculated position is based upon gravity that is exerted upon the collector. A check 710 can conclude if the collector should move based upon a result of the comparison. According to one embodiment, any difference between the calculated location and expected location can result in suggested movement. However, other configurations can be practiced, such as allowing slight tolerances.

If the check 710 concludes movement is not appropriate, then the methodology 700 can return to computing a desired location. A loop can be formed to keep checking until a movement is appropriate; however, there can be procedures for terminating the methodology 700 upon this conclusion. If the conclusion is positive that movement is appropriate, then the example methodology 700 can include producing an instruction set on how to move the collector to about the desired location at event 712. Verification can take place regarding the instruction set and at act 714 the example methodology 700 can include transferring the instruction set to a movement entity, the movement entity associated with the collector implements the instruction set.

Figure 8:
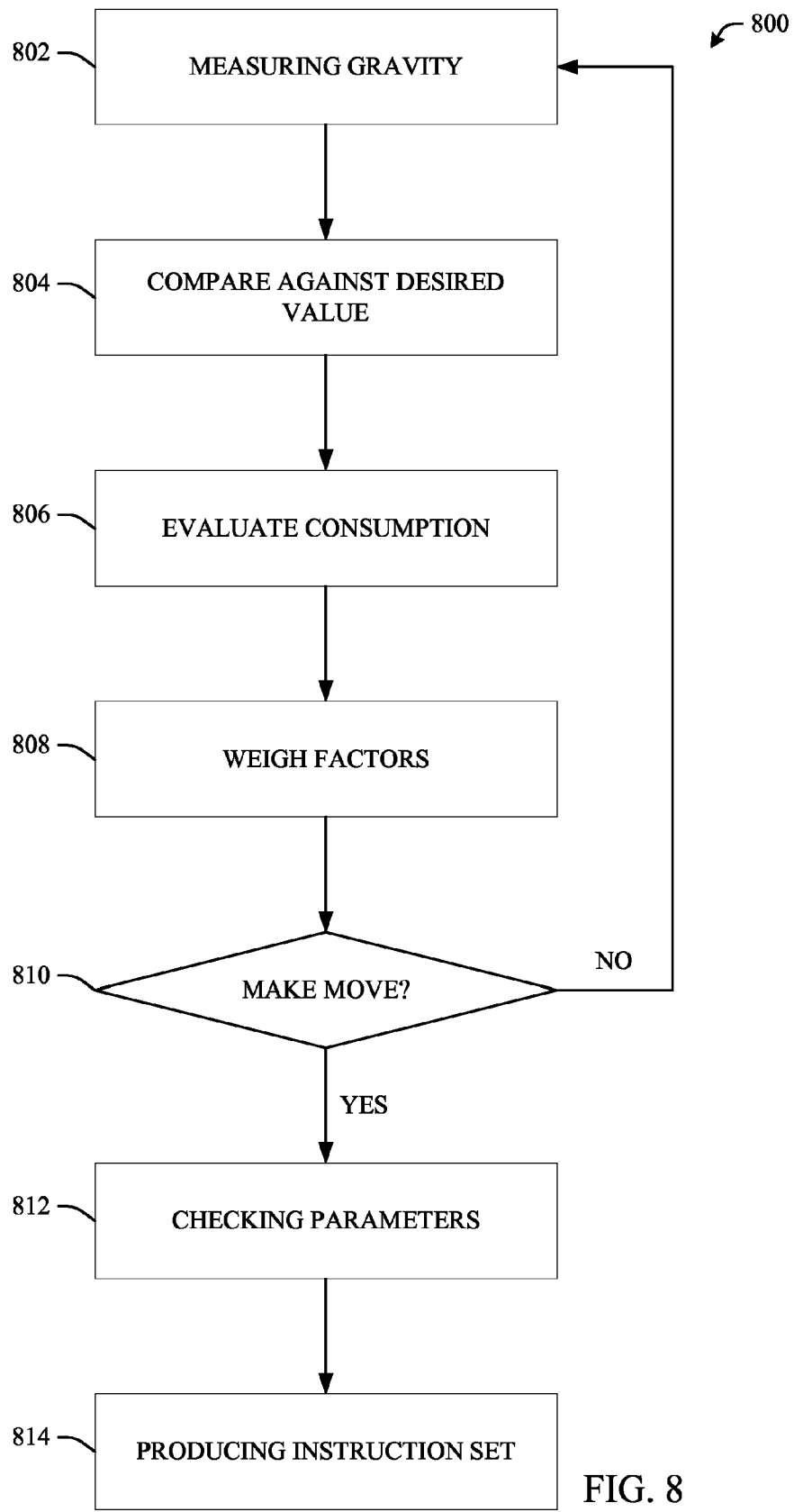
FIG. 8 illustrates a representative methodology for performing gravity-based analysis concerning energy collection in accordance with an aspect of the subject specification.

Now referring to FIG. 8, an example methodology 800 is disclosed for determining movement related to an energy collector. A measurement of gravity upon a collector can be taken at event 802. For example, an inclinometer can measure a net force of gravity along two axes. A pair of inclinometers can be firmly attached to a solar dish in such a way that an angle that the dish is pointed with respect to gravity can be measured. This data serves as feedback to a microprocessor that compares the actual value against a desired value at act 804. The desired value can be computed from latitude and longitude of an installation and/or time and date, which establishes the direction that the concentrator should point. This desired value can be expressed as a direction relative to the gravity vector.

It is possible that alignment of the concentrator should not be the only factor taken into account when determining if a move should occur. For instance, at event 806 the example methodology 800 can include estimating an amount of power that is appropriate to move the concentrator from an actual position to a desired position. Different factors (e.g., energy loss from concentrator not being in desired position identified through an estimation, estimated power consumption, etc.) can be weighed against one another at act 808 and a determination can be made if the dish should move at event 810; weighing of the different factors can include implementing cost-utility analysis of the benefit of moving the concentrator versus expense(s) associated therewith, wherein the expense(s) can comprise power consumption, cost to implement maintenance configuration (e.g., a safe position of the concentrator), or the like. In an example scenario, when the concentration is operated in adverse weather condition(s), e.g., sustained high wind, cloudy atmosphere, cost of power consumed to move the concentrator can outweigh the benefit of operation in a desired position. If the dish should not move, then the methodology 800 can return to measuring gravity. However, if it is determined that the dish should move, then parameters of a motor can be evaluated at act 812 and a direction set can be produced to have the motor move the dish accordingly at event 814.

For purposes of simplicity of explanation, methodologies that can be implemented in accordance with the disclosed subject matter were shown and described as a series of blocks. However, it is to be understood and appreciated that the claimed subject matter is not limited by the order of the blocks, as some blocks can occur in different orders and/or concurrently with other blocks from what is depicted and described herein. Moreover, not all illustrated blocks can be required to implement the methodologies described hereinafter. Additionally, it should be further appreciated that the methodologies disclosed throughout this specification are capable of being stored on an article of manufacture to facilitate transporting and transferring such methodologies to computers. The term article of manufacture, as used, is intended to encompass a computer program accessible from any computer-readable device, carrier, or media.

Figure 9:
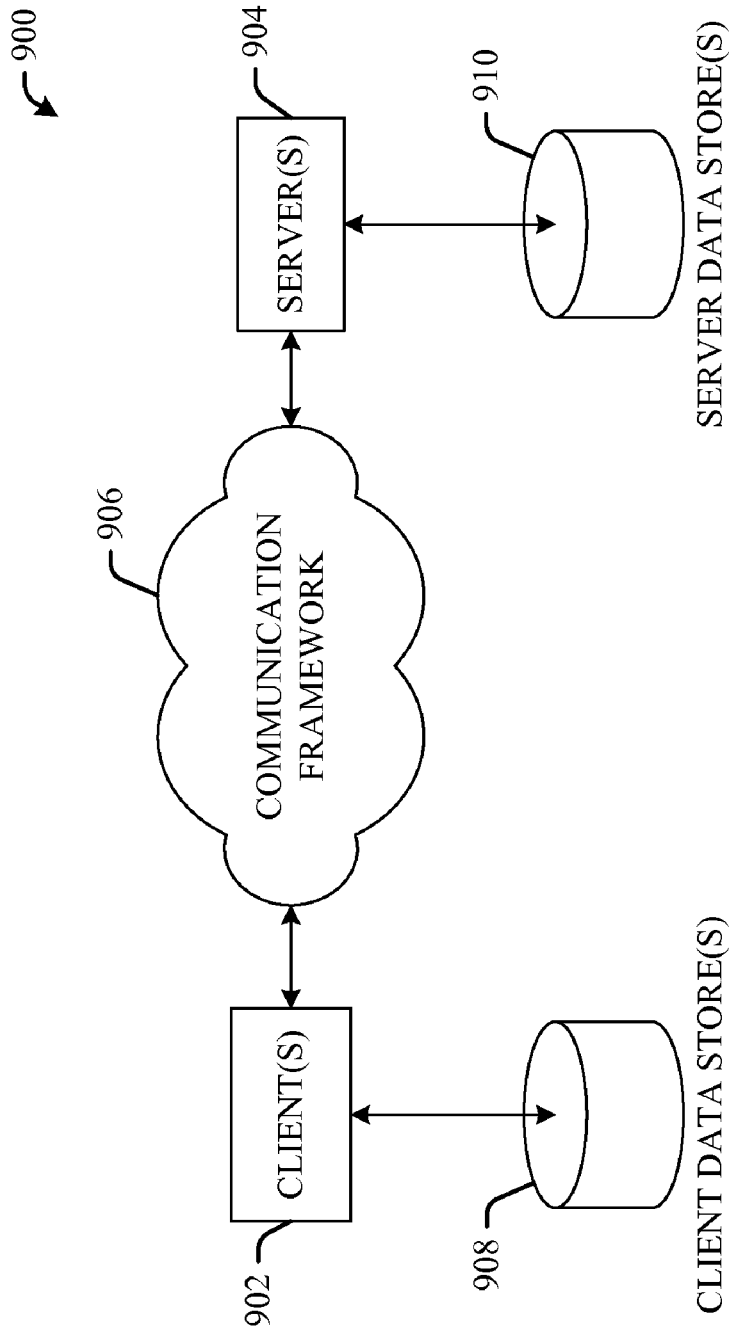
FIG. 9 illustrates an example of a schematic block diagram of a computing environment in accordance with an aspect subject specification.
Figure 10:
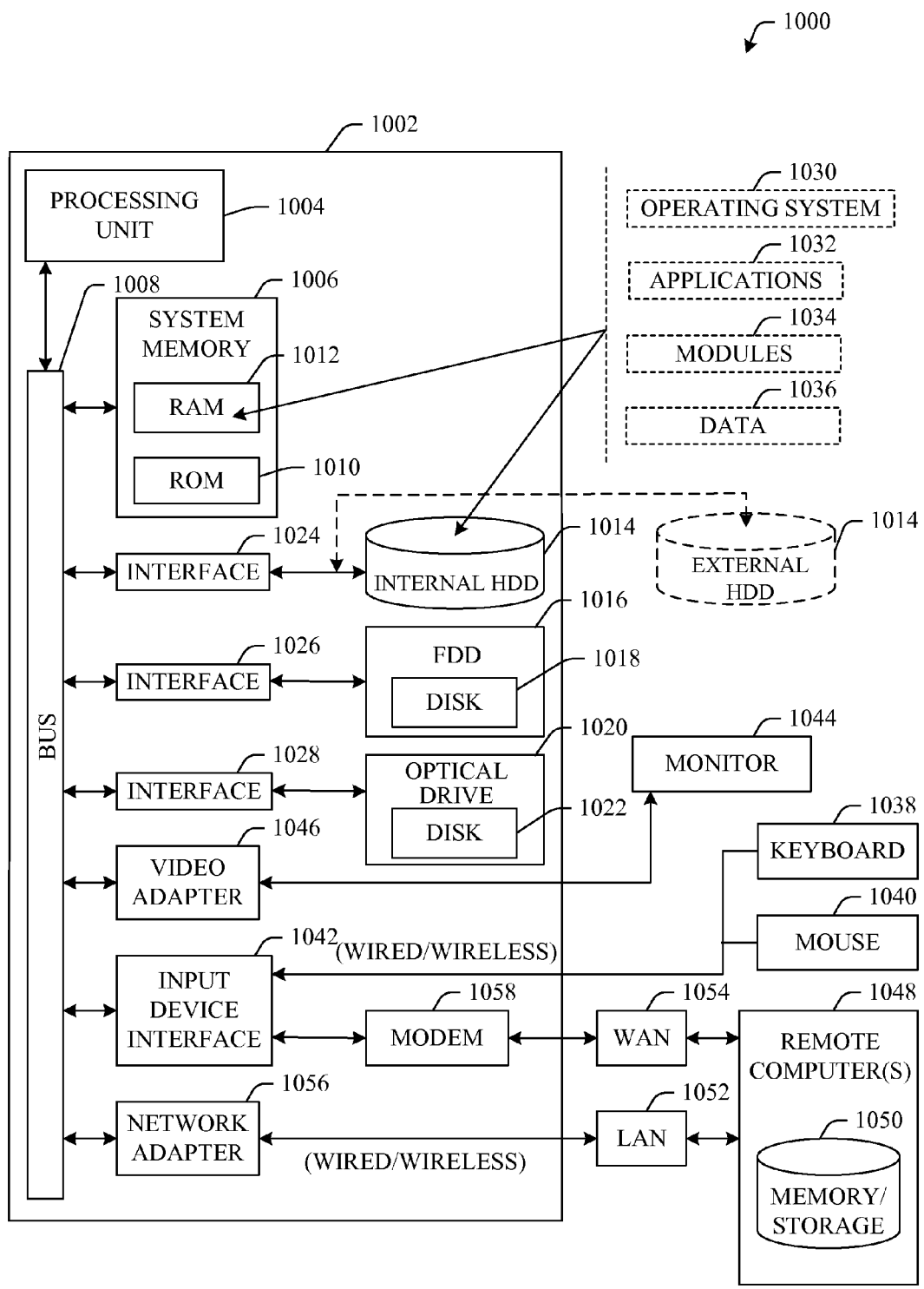
FIG. 10 illustrates an example of a block diagram of a computer operable to execute the disclosed architecture.

In order to provide a context for the various aspects of the disclosed subject matter, FIGS. 9 and 10 as well as the following discussion are intended to provide a brief, general description of a suitable environment in which the various aspects of the disclosed subject matter can be implemented. While the subject matter has been described above in the general context of computer-executable instructions of a program that runs on one or more computers, those skilled in the art will recognize that the subject matter described herein also can be implemented in combination with other program modules. Generally, program modules include routines, programs, components, data structures, etc. that perform particular tasks and/or implement particular abstract data types. Moreover, those skilled in the art will appreciate that the inventive methods can be practiced with other computer system configurations, including single-processor, multiprocessor or multi-core processor computer systems, mini-computing devices, mainframe computers, as well as personal computers, hand-held computing devices (e.g., personal digital assistant (PDA), phone, watch . . . ), microprocessor-based or programmable consumer or industrial electronics, and the like. The illustrated aspects can also be practiced in distributed computing environments where tasks are performed by remote processing devices that are linked through a communications network. However, some, if not all aspects of the claimed subject matter can be practiced on stand-alone computers. In a distributed computing environment, program modules can be located in both local and remote memory storage devices.

Referring now to FIG. 9, there is illustrated a schematic block diagram of a computing environment 900 in accordance with the subject specification. The system 900 includes one or more client(s) 902. The client(s) 902 can be hardware and/or software (e.g., threads, processes, computing devices). The client(s) 902 can house cookie(s) and/or associated contextual information by employing the specification, for example.

The system 900 also includes one or more server(s) 904. The server(s) 904 can also be hardware and/or software (e.g., threads, processes, computing devices). The servers 904 can house threads to perform transformations by employing the specification, for example. One possible communication between a client 902 and a server 904 can be in the form of a data packet adapted to be transmitted between two or more computer processes. The data packet can include a cookie and/or associated contextual information, for example. The system 900 includes a communication framework 906 (e.g., a global communication network such as the Internet) that can be employed to facilitate communications between the client(s) 902 and the server(s) 904.

Communications can be facilitated via a wired (including optical fiber) and/or wireless technology. The client(s) 902 are operatively connected to one or more client data store(s) 908 that can be employed to store information local to the client(s) 902 (e.g., cookie(s) and/or associated contextual information). Similarly, the server(s) 904 are operatively connected to one or more server data store(s) 910 that can be employed to store information local to the servers 904.

Referring now to FIG. 10, there is illustrated a block diagram of a computer operable to execute the disclosed architecture. In order to provide additional context for various aspects of the subject specification, FIG. 10 and the following discussion are intended to provide a brief, general description of a suitable computing environment 1000 in which the various aspects of the specification can be implemented. While the specification has been described above in the general context of computer-executable instructions that can run on one or more computers, those skilled in the art will recognize that the specification also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the specification can also be practiced in distributed computing environments where certain tasks are performed by remote processing devices that are linked through a communications network. In a distributed computing environment, program modules can be located in both local and remote memory storage devices.

A computer typically includes a variety of computer-readable media. Computer-readable media can be any available media that can be accessed by the computer and includes both volatile and nonvolatile media, removable and non-removable media. By way of example, and not limitation, computer-readable media can comprise computer storage media and communication media. Computer storage media includes volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or any other medium which can be used to store the desired information and which can be accessed by the computer.

Communication media typically embody computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared and other wireless media. Combinations of the any of the above should also be included within the scope of computer-readable media.

With reference again to FIG. 10, the example environment 1000 for implementing various aspects of the specification includes a computer 1002, the computer 1002 including a processing unit 1004, a system memory 1006 and a system bus 1008. The system bus 1008 couples system components including, but not limited to, the system memory 1006 to the processing unit 1004. The processing unit 1004 can be any of various commercially available processors or proprietary specific configured processors. Dual microprocessors and other multi-processor architectures can also be employed as the processing unit 1004.

The system bus 1008 can be any of several types of bus structure that can further interconnect to a memory bus (with or without a memory controller), a peripheral bus, and a local bus using any of a variety of commercially available bus architectures. The system memory 1006 includes read-only memory (ROM) 1010 and random access memory (RAM) 1012. A basic input/output system (BIOS) is stored in a non-volatile memory 1010 such as ROM, EPROM, EEPROM, which BIOS contains the basic routines that help to transfer information between elements within the computer 1002, such as during start-up. The RAM 1012 can also include a high-speed RAM such as static RAM for caching data.

The computer 1002 further includes an internal hard disk drive (HDD) 1014 (e.g., EIDE, SATA), which internal hard disk drive 1014 can also be configured for external use in a suitable chassis (not shown), a magnetic floppy disk drive (FDD) 1016, (e.g., to read from or write to a removable diskette 1018) and an optical disk drive 1020, (e.g., reading a CD-ROM disk 1022 or, to read from or write to other high capacity optical media such as the DVD). The hard disk drive 1014, magnetic disk drive 1016 and optical disk drive 1020 can be connected to the system bus 1008 by a hard disk drive interface 1024, a magnetic disk drive interface 1026 and an optical drive interface 1028, respectively. The interface 1024 for external drive implementations includes at least one or both of Universal Serial Bus (USB) and IEEE 1394 interface technologies. Other external drive connection technologies are within contemplation of the subject specification.

The drives and their associated computer-readable media provide nonvolatile storage of data, data structures, computer-executable instructions, and so forth. For the computer 1002, the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer, such as zip drives, magnetic cassettes, flash memory cards, cartridges, and the like, can also be used in the example operating environment, and further, that any such media can contain computer-executable instructions for performing the methods of the specification.

A number of program modules can be stored in the drives and RAM 1012, including an operating system 1030, one or more application programs 1032, other program modules 1034 and program data 1036. All or portions of the operating system, applications, modules, and/or data can also be cached in the RAM 1012. It is appreciated that the specification can be implemented with various proprietary or commercially available operating systems or combinations of operating systems.

A user can enter commands and information into the computer 1002 through one or more wired/wireless input devices, e.g., a keyboard 1038 and a pointing device, such as a mouse 1040. Other input devices (not shown) can include a microphone, an IR remote control, a joystick, a game pad, a stylus pen, touch screen, or the like. These and other input devices are often connected to the processing unit 1004 through an input device interface 1042 that is coupled to the system bus 1008, but can be connected by other interfaces, such as a parallel port, an IEEE 1394 serial port, a game port, a USB port, an IR interface, etc.

A monitor 1044 or other type of display device is also connected to the system bus 1008 via an interface, such as a video adapter 1046. In addition to the monitor 1044, a computer typically includes other peripheral output devices (not shown), such as speakers, printers, etc.

The computer 1002 can operate in a networked environment using logical connections via wired and/or wireless communications to one or more remote computers, such as a remote computer(s) 1048. The remote computer(s) 1048 can be a workstation, a server computer, a router, a personal computer, portable computer, microprocessor-based entertainment appliance, a peer device or other common network node, and typically includes many or all of the elements described relative to the computer 1002, although, for purposes of brevity, only a memory/storage device 1050 is illustrated. The logical connections depicted include wired/wireless connectivity to a local area network (LAN) 1052 and/or larger networks, e.g., a wide area network (WAN) 1054. Such LAN and WAN networking environments are commonplace in offices and companies, and facilitate enterprise-wide computer networks, such as intranets, all of which can connect to a global communications network, e.g., the Internet.

When used in a LAN networking environment, the computer 1002 is connected to the local network 1052 through a wired and/or wireless communication network interface or adapter 1056. The adapter 1056 can facilitate wired or wireless communication to the LAN 1052, which can also include a wireless access point disposed thereon for communicating with the wireless adapter 1056.

When used in a WAN networking environment, the computer 1002 can include a modem 1058, or is connected to a communications server on the WAN 1054, or has other means for establishing communications over the WAN 1054, such as by way of the Internet. The modem 1058, which can be internal or external and a wired or wireless device, is connected to the system bus 1008 via the input device interface 1042. In a networked environment, program modules depicted relative to the computer 1002, or portions thereof, can be stored in the remote memory/storage device 1050. It will be appreciated that the network connections shown are example and other means of establishing a communications link between the computers can be used.

The computer 1002 is operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This includes at least Wi-Fi and Bluetooth™ wireless technologies. Thus, the communication can be a predefined structure as with a conventional network or simply an ad hoc communication between at least two devices.

Wi-Fi, or Wireless Fidelity, allows connection to the Internet from a couch at home, a bed in a hotel room, or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, etc.) to provide secure, reliable, fast wireless connectivity. A Wi-Fi network can be used to connect computers to each other, to the Internet, and to wired networks (which use IEEE 802.3 or Ethernet). Wi-Fi networks operate in the unlicensed 2.4 and 5 GHz radio bands, at an 11 Mbps (802.11a) or 54 Mbps (802.11b) data rate, for example, or with products that contain both bands (dual band), so the networks can provide real-world performance similar to the basic 10BaseT wired Ethernet networks used in many offices.

The aforementioned systems have been described with respect to interaction among several components. It should be appreciated that such systems and components can include those components or sub-components specified therein, some of the specified components or sub-components, and/or additional components. Sub-components can also be implemented as components communicatively coupled to other components rather than included within parent components. Additionally, it should be noted that one or more components could be combined into a single component providing aggregate functionality. The components could also interact with one or more other components not specifically described herein but known by those of skill in the art.

As used herein, the terms to "infer" or "inference" refer generally to the process of reasoning about or deducing states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

Furthermore, the claimed subject matter can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications can be made to this configuration without departing from the scope or spirit of the claimed subject matter.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to disclose concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. It is to be appreciated that determinations or inferences referenced throughout the subject specification can be practiced through use of artificial intelligence techniques.

What has been described above includes examples of the subject specification. It is, of course, not possible to describe every conceivable combination of components or methodologies for purposes of describing the subject specification, but one of ordinary skill in the art can recognize that many further combinations and permutations of the subject specification are possible. Accordingly, the subject specification is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A solar collector, comprising:
a memory configured to store computer executable components; and
a processor configured to execute the following computer executable components stored in the memory:
an assessment component that determines a concentrator position based upon an angle of gravity upon the concentrator, wherein the angle of gravity is defined as a measurement of a net force of gravity upon the concentrator along two axes;
an obtainment component that collects, from the assessment component, metadata related to the concentrator position; and
an evaluation component that compares the concentrator position with a desired position of the concentrator in relation to an anticipated position of a celestial energy source, the comparison is used to determine a manner in which to make an alteration to increase effectiveness of the concentrator.

2. The solar collector of claim 1, further comprising a conclusion component that determines if movement should occur as a function of a result of the comparison, wherein the conclusion component determines movement should not occur if power consumed to move the concentrator outweighs the effectiveness of the concentrator at the new position.

3. The solar collector of claim 2, further comprising a production component that generates a direction set that is used by a movement component to determine how movement should occur.

4. The solar collector of claim 3, further comprising a feedback component that determines if the direction set resulted in a desired outcome upon the direction set being implemented by a movement component.

5. The solar collector of claim 4, further comprising an adaptation component that modifies operation of the production component with regard to the determination made that concerns direction set.

6. The solar collector of claim 1, further comprising a correction component that automatically corrects a misalignment or an offset of the assessment component.

7. The solar collector of claim 6, further comprising a determination component that identifies the misalignment or the offset.

8. The solar collector of claim 1, further comprising a computation component that calculates the desired position of the energy source used by the evaluation component in the comparison, wherein the computation component utilizes a date, a time, a longitude, and a latitude to calculate the desired position.

9. The solar collector of claim 1, the metadata is collected from an inclinometer.

10. A method, comprising:
    comparing a calculated location of an energy collector against an expected location of the energy collector, the calculated position is based upon a measurement of an angle of gravity upon the collector, wherein the angle of gravity is a measurement of a net force of gravity upon the concentrator along two axes;
    concluding the energy collector should move based upon a result of the comparison; and
    moving the energy collector from the calculated location to the expected location as a function of the gravity exerted upon the energy collector.

11. The method of claim 10, further comprising computing the expected location of the energy collector, based upon date, time, longitude of the collector, and latitude of the energy collector.

12. The method of claim 10, wherein the concluding comprises implementing at least one artificial intelligence technique.

13. The method of claim 12, wherein the implementing comprises performing a cost-utility analysis of the benefit of moving the energy collector versus an expense associated therewith, wherein the expense comprises power consumption.

14. The method of claim 10, further comprising producing an instruction set on how to move the energy collector to the expected location.

15. The method of claim 14, further comprising transferring the instruction set to a movement entity, the movement entity is associated with the collector and implements the instruction set.

16. The method of claim 10, further comprising calculating the location of the energy collector through use of an inclinometer.

17. A solar power collector, comprising:
    means for calculating the location of the solar power collector through analysis of metadata that relates to gravity exerted upon the collector;
    means for computing the desired location of the solar power collector, the calculation is based upon date, time, longitude of the receiver, and latitude of the collector;
    means for comparing the calculated location of the solar power collector against the desired location of the solar power collector;
    means for effecting cost-utility analysis of the benefit of moving the solar power collector and associated expense; and
    means for concluding if the solar power collector should move based upon a result of the comparison and the cost-utility analysis.

18. The solar power collector of claim 17, further comprising means for obtaining the metadata that relates to gravity exerted upon the solar power collector from a means for measuring a force exerted by gravity.

19. The solar power collector of claim 17, wherein the associated expense comprises power consumption.

20. The solar power collector of claim 18, further comprising:
    means for identifying a misalignment or an offset of the means for measuring the position of the solar power collector with respect to gravity; and
    means for correcting a misalignment or an offset of the means for measuring the position of the collector with respect to gravity.

21. The solar power collector of claim 18, further comprising:
    means for producing a direction set, the direction set instructs how the collector should be moved and is implemented by a collector shift entity;
    means for transferring the instruction set to the collector shift entity, the collector shift entity implements the instruction set;
    means for determining if the direction set resulted in a desired outcome upon the direction set being implemented by the collector shift entity; and
    means for modifying operation of the means for producing concerning the determination made that concerns direction set.

* * * * *